US 9,237,680 B2

(12) United States Patent
Murayama et al.

(10) Patent No.: US 9,237,680 B2
(45) Date of Patent: Jan. 12, 2016

(54) SERVER ROOM MANAGING AIR CONDITIONING SYSTEM AND AIR CONDITIONING CONTROL METHOD

(75) Inventors: Dai Murayama, Musashino (JP); Yasuo Takagi, Chigasaki (JP); Yuuichi Hanada, Saitama (JP); Hideyoshi Ootani, Chiba (JP); Tomoyuki Kinoshita, Yokohama (JP); Hiroshi Morimoto, Tokyo (JP); Koubun Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 967 days.

(21) Appl. No.: 13/410,504

(22) Filed: Mar. 2, 2012

(65) Prior Publication Data

US 2012/0164930 A1    Jun. 28, 2012

Related U.S. Application Data

(63) Continuation of application No. PCT/JP2011/073935, filed on Oct. 18, 2011.

(30) Foreign Application Priority Data

Nov. 2, 2010    (JP) ................................ P2010-264041

(51) Int. Cl.
*G05B 13/00* (2006.01)
*G05D 27/00* (2006.01)
(Continued)

(52) U.S. Cl.
CPC .......... *H05K 7/20745* (2013.01); *F24F 11/006* (2013.01); *H05K 7/20836* (2013.01); *F24F 2011/0067* (2013.01)

(58) Field of Classification Search
CPC .......... H05K 7/20745; H05K 7/20836; G05D 16/2073; G05D 16/0602; G05D 16/0605; G05D 16/2066; F24F 11/006; F24F 2011/0067

USPC .......... 454/184; 361/690, 695; 700/276, 275, 700/51, 32, 33, 40–43
See application file for complete search history.

(56) References Cited

U.S. PATENT DOCUMENTS 2,473,717 A * 6/1949 Markson .......................... 73/751
5,152,814 A * 10/1992 Nelson ............................. 96/224
(Continued)

FOREIGN PATENT DOCUMENTS

| JP | 07-035369 | 2/1995 |
| JP | 09-060924 | 3/1997 |

(Continued)

OTHER PUBLICATIONS

Official Communication issued by the Japanese Patent Office on Jan. 17, 2012, for Japanese Patent Application No. 2010-246041, and a partial English-language translation thereof.
(Continued)

*Primary Examiner* — Steven B McAllister
*Assistant Examiner* — Frances F Hamilton
(74) *Attorney, Agent, or Firm* — Finnegan, Henderson, Farabow, Garrett & Dunner, L.L.P.

(57) ABSTRACT

In an embodiment, an air conditioning system for managing a server room, which has first and second spaces separated from each other, in which a server is installed between the first and second spaces, and supply air flowed into the first space is heated by heat generation of the server, and flows out as return air via the second space, includes: a cold air generation device; an air supply fan; a first differential pressure gauge; and a control device. The cold air generation device generates supply air satisfying a predetermined condition. The air supply fan flows the generated supply air into the first space. The first differential pressure gauge measures a differential pressure of a static pressure of the second space with respect to a static pressure of the first space.

6 Claims, 9 Drawing Sheets

(51) Int. Cl.
*H05K 7/20* (2006.01)
*F24F 11/00* (2006.01)

(56) References Cited

U.S. PATENT DOCUMENTS

| | | | | |
|---|---|---|---|---|
| 5,410,448 A * | 4/1995 | Barker et al. | ................ | 361/695 |
| 5,544,012 A * | 8/1996 | Koike | ................ | H05K 7/20572 |
| | | | | 165/122 |
| 6,033,302 A * | 3/2000 | Ahmed et al. | ................ | 454/238 |
| 6,224,679 B1 * | 5/2001 | Sasaki et al. | ................ | 118/719 |
| 6,463,397 B1 * | 10/2002 | Cohen et al. | ................ | 702/140 |
| 6,694,759 B1 * | 2/2004 | Bash | ................ | G05D 16/202 |
| | | | | 236/49.3 |
| 7,640,760 B2 * | 1/2010 | Bash | ................ | F24F 11/0012 |
| | | | | 62/178 |
| 7,854,652 B2 * | 12/2010 | Yates | ................ | E04H 5/02 |
| | | | | 361/690 |
| 7,996,161 B2 * | 8/2011 | Klosinski et al. | ................ | 702/50 |
| 8,072,780 B1 * | 12/2011 | Roy | ................ | 361/825 |
| 8,180,495 B1 * | 5/2012 | Roy | ................ | H05K 7/20745 |
| | | | | 165/67 |
| 8,300,410 B2 * | 10/2012 | Slessman | ................ | H05K 7/20736 |
| | | | | 165/104.33 |
| 8,348,731 B2 * | 1/2013 | Johnson | ................ | G06F 1/206 |
| | | | | 361/695 |
| 8,427,830 B2 * | 4/2013 | Absalom | ................ | H05K 7/20745 |
| | | | | 361/679.51 |
| 8,469,782 B1 * | 6/2013 | Roy | ................ | H05K 7/20745 |
| | | | | 454/184 |
| 8,523,643 B1 * | 9/2013 | Roy | ................ | G06F 1/20 |
| | | | | 454/184 |
| 8,596,079 B2 * | 12/2013 | Beam | ................ | F24F 11/0012 |
| | | | | 165/205 |
| 8,783,336 B2 * | 7/2014 | Slessman | ................ | 165/222 |
| 8,914,155 B1 * | 12/2014 | Shah | ................ | H05K 7/20 |
| | | | | 700/19 |
| 2007/0131029 A1 * | 6/2007 | Tsai et al. | ................ | 73/488 |
| 2007/0173189 A1 * | 7/2007 | Lewis | ................ | H05K 7/20009 |
| | | | | 454/184 |
| 2008/0046133 A1 * | 2/2008 | Jingu | ................ | F24F 3/161 |
| | | | | 700/301 |
| 2008/0098763 A1 * | 5/2008 | Yamaoka | ................ | H05K 7/20745 |
| | | | | 62/259.2 |
| 2008/0140259 A1 * | 6/2008 | Bash | ................ | G05D 23/192 |
| | | | | 700/278 |
| 2009/0088873 A1 * | 4/2009 | Avery | ................ | G06F 1/206 |
| | | | | 700/51 |
| 2009/0168345 A1 * | 7/2009 | Martini | ................ | F24F 11/0001 |
| | | | | 361/691 |
| 2009/0277622 A1 * | 11/2009 | Nair | ................ | F24F 11/0001 |
| | | | | 165/246 |
| 2010/0057258 A1 * | 3/2010 | Clanin | ................ | F24F 11/0001 |
| | | | | 700/276 |
| 2010/0064714 A1 * | 3/2010 | Tashiro | ................ | H05K 7/20745 |
| | | | | 62/259.2 |
| 2010/0139908 A1 * | 6/2010 | Slessman | ................ | F28F 9/0265 |
| | | | | 165/279 |
| 2010/0304657 A1 * | 12/2010 | Gallmann | ................ | G06F 1/20 |
| | | | | 454/184 |
| 2011/0128699 A1 * | 6/2011 | Heydari | ................ | H05K 7/20836 |
| | | | | 361/679.48 |
| 2011/0195652 A1 * | 8/2011 | Smith | ................ | F24F 11/008 |
| | | | | 454/184 |
| 2011/0256822 A1 * | 10/2011 | Carlson | ................ | H05K 7/20827 |
| | | | | 454/184 |
| 2012/0041600 A1 * | 2/2012 | Michael | ................ | G05D 23/1932 |
| | | | | 700/276 |
| 2012/0167670 A1 * | 7/2012 | Bean et al. | ................ | 73/40.5 R |
| 2013/0048266 A1 * | 2/2013 | Bauchot | ................ | H05K 7/20836 |
| | | | | 165/299 |

FOREIGN PATENT DOCUMENTS

| | | |
|---|---|---|
| JP | 2009-257721 | 11/2009 |
| JP | 2010-043817 | 2/2010 |
| JP | 2010-072697 | 4/2010 |
| JP | 2010-108359 | 5/2010 |
| JP | 2011-123547 | 6/2011 |

OTHER PUBLICATIONS

International Search Report issued by the Japanese Patent Office on Jan. 24, 2012, for International Patent Application No. PCT/JP2011/073935.

* cited by examiner

SERVER ROOM MANAGING AIR CONDITIONING SYSTEM AND AIR CONDITIONING CONTROL METHOD

CROSS-REFERENCE TO RELATED APPLICATION

This application is a Continuation of PCT Application No. PCT/JP2011/73935, filed on Oct. 18, 2011, and claims the priority of Japanese Patent Application No. 2010-246041, filed on Nov. 2, 2010, the content of both of which is incorporated herein by reference.

TECHNICAL FIELD

Embodiments of the present invention relate to server room managing air conditioning system and air conditioning control method.

BACKGROUND ART

In recent years, as use of the information technology has been being widespread and advanced in a variety of fields, necessity of a data center that provides a customer with a connection line to a network, maintenance/operation services, and the like has been rising.

In general, in the data center, a heat generation amount therein is large since a large number of servers are installed therein. In order to normally operate these servers, it is necessary to keep the data center under environmental conditions within a predetermined range by appropriately performing air conditioning.

As a technology for cooling an inside of a room in which a large number of computers are installed as in the data center, the following has been proposed. An inside of the data center is composed to be partitioned into two spaces, which are: an air supply-side space (cold area) to the servers; and an air exhaust-side space (hot area) therefrom, a cold air is blown into the cold area by an air supply fan, and airflow is formed so that a warm air warmed as a result that the cold air in the cold area is sucked by fans in the servers can be blown out to the hot area.

With such a configuration, a temperature gradient in such an area of the room inside is reduced, and in addition, variations in an air supply temperature are reduced, whereby air conditioning control with a high energy saving effect and good efficiency can be performed.

PRIOR ART LITERATURE

Patent Literature

Patent Literature 1: Japanese Patent Laid-Open Publication No. 2010-108359

DISCLOSURE OF THE INVENTION

Problems to be Solved by the Invention

In the above-mentioned data center partitioned into the two spaces, control is performed so that the cold air sucked by the fans in the servers can satisfy conditions within a predetermined range, whereby it becomes possible to perform the appropriate air conditioning. However, an air conditioning system has been required, which is capable of obtaining definite effects more efficiently.

The present invention has been made in consideration of the above-described circumstances. It is an object of the present invention to provide server room managing air conditioning system and air conditioning control method, which are capable of executing air conditioning control with good operation efficiency and a high energy saving effect in the server room.

Means for Solving the Problems

In accordance with embodiments for achieving the foregoing object, an air conditioning system for managing a server room, which has first and second spaces separated from, each other, in which a server is installed between the first and second spaces, and supply air flowed into the first space is heated by heat generation of the server, and flews out as return air via the second space, includes: a cold air generation device; an air supply fan; a first differential pressure gauge; and a control device. The cold air generation device generates supply air satisfying a predetermined condition. The air supply fan flows the generated supply air into the first space. The first differential pressure gauge measures a differential pressure of a static pressure of the second space with respect to a static pressure of the first space. The control device decides a control setting value of the rotating speed of the air supply fan, which serves for setting the measured differential pressure at a preset reference value, and controls the rotating speed of the air supply fan based on this control setting value.

BEST MODE FOR CARRYING OUT THE INVENTION

First Embodiment (Configuration of Server Room Managing Air Conditioning System According to First Embodiment)

Figure 1:
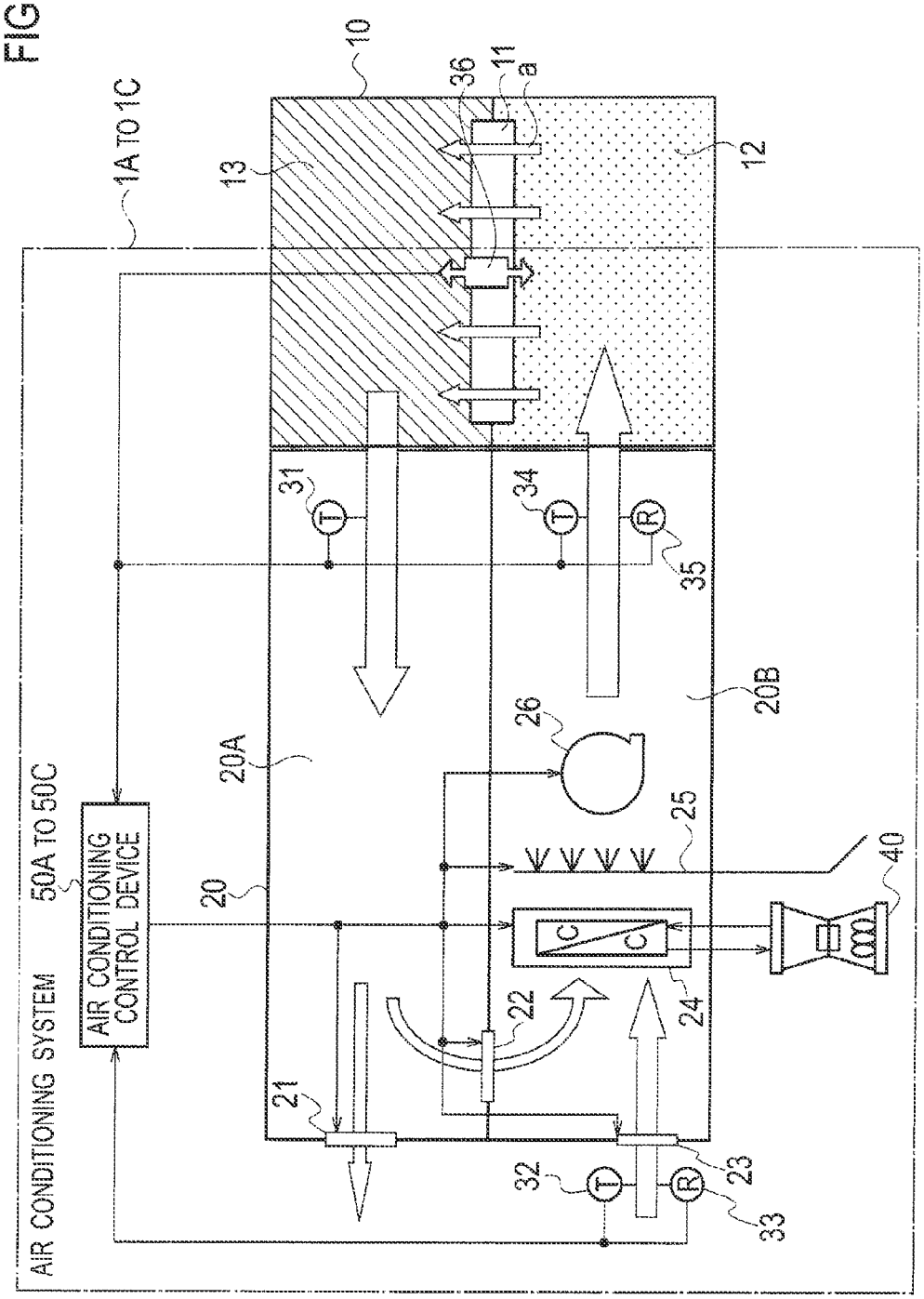
FIG. 1 is an overall view showing a configuration of an air conditioning system according to a first embodiment.
Figure 2:
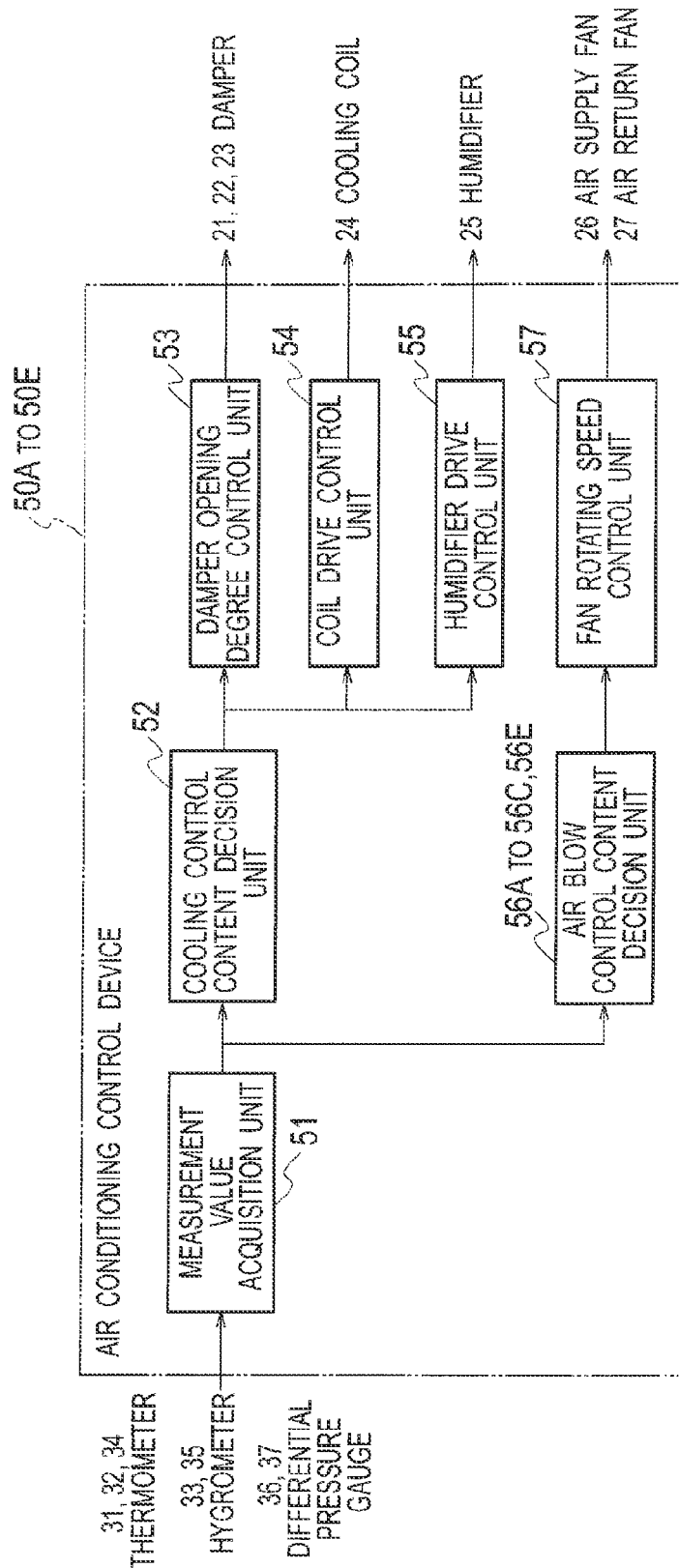
FIG. 2 is a block diagram showing a configuration of an air conditioning control device of the air conditioning system according to the first embodiment.
Figure 3:
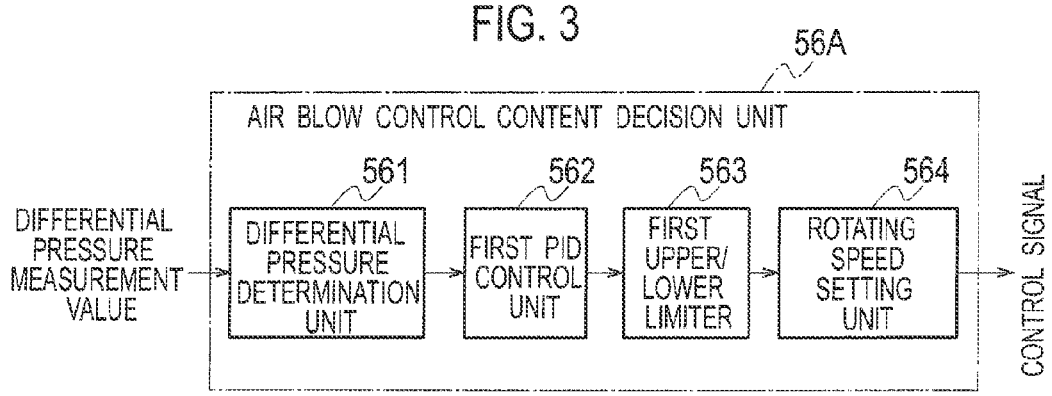
FIG. 3 is a block diagram showing a configuration of an air blow control content decision unit of the air conditioning control device of the air conditioning system according to the first embodiment.

A description is made of a configuration of a server room managing air conditioning system 1A according to a first embodiment of the present invention with reference to FIGS. 1 to 3.

The air conditioning system 1A according to this embodiment performs air conditioning for a server room 10 of a data center or the like. An inside of the server room 10 is separated into a cold area 12 as a first space and a hot area 13 as a second space, and a server rack 11, in which a plurality of servers (not shown) are housed, is installed between the cold area 12 and the hot area 13.

Then, by operations of fans (not shown) in the servers housed in this server rack 11, as shown by arrows a, cold air supplied from an indoor machine 20 to the cold, area 12 is sucked into the servers of the server rack 11, and airflow is generated so that the air supplied to the servers can be flowed out, to the hot area 13, as return air heated by heat generation of the servers. Then, in the servers, heat generated therein is cooled by the cold air sucked thereinto, and the servers become normally operable.

The air conditioning system 1A includes: the indoor machine 20; an outdoor machine 40; and an air conditioning control device 50A.

The indoor machine 20 includes: a return air suction area 20A connected to the hot area 13 of the server room 10; and a supply air cooling area 20B connected to the cold area 12 of the server room 10, in which an exhausting damper 21 is installed in the return air suction area 20A, a return air introducing damper 22 is installed between the return air suction area 20A and the supply air cooling area 20B, and in the supply air cooling area 20B, there are installed an outside air introducing damper 23, a cooling coil 24 as a cold air generation device, a humidifier 25, and an air supply fan 26.

The exhausting damper 21 adjusts, by an opening degree thereof, an amount of return air that flows from the hot area 13 of the server room 10 into the return air suction area 20A and is exhausted to the outside.

The return air introducing damper 22 adjusts, by an opening degree thereof, an amount of the return air introduced from the return air suction area 20A to the supply air cooling area 20B.

The outside air introducing damper 23 adjusts, by an opening degree thereof, an out of the outside air introduced from the outside into the supply air cooling area 20B.

According to needs, the cooling coil 24 cools the outside air, which is introduced thereinto when the outside air-introducing damper 23 is turned to an open state, and the return air introduced thereinto from the return air suction area 20A when the return air introducing damper 22 is turned ton an open state, thereby generating the cold air.

According to needs, the humidifier 25 humidifies the outside air and the return air, which are introduced thereinto.

The air supply fan 26 flows the cold air, which is generated by being cooled by the cooling coil 24 according to needs and by being humidified by the humidifier 25 according to needs, as supply air into the cold area 12 of the server room 10.

Moreover, in the return air suction area 20A, a return air thermometer 31, which measures a temperature of the return air flowed thereinto from the hot area 13, is installed. On the outside of the indoor machine 20, there are installed: an outside air thermometer 32 that measures a temperature of the outside air; and an outside air hygrometer 33 that measures a humidity of the outside air. Downstream of the air supply fan 26 in the supply air cooling area 20B, there are installed: a supply air thermometer 34 that measures a temperature of the supply air flowed into the cold area 12 of the server room 10; and a supply air hygrometer 35 that measures a humidity of the supply air thus flowed thereinto.

Moreover, between the cold, area 12 and the hot area 13 in the server room 10, a differential pressure gauge 36, which measures a differential pressure as a difference in static pressure between the cold area 12 and the hot area 13, is installed. As the differential pressure gauge, there are: one that can measure a positive pressure and a negative pressure; and one that can only measure the positive pressure. In this embodiment, it is necessary to recognize in which area and to which extent the static pressure is higher, and accordingly, in the case of using the differential pressure gauge that can only measure the positive pressure, two gauges are set: which are: a differential pressure gauge that measures a differential pressure (dp1) of the cold area 12 with respect, to the hot area 13; and a differential pressure gauge that measures a differential pressure (dp2) of the hot area 13 with respect to the cold area 12.

The outdoor machine 40 is connected to the cooling coil 24, and supplies thereto a refrigerant for use in the event of generating the cold air in the cooling coil 24.

As shown in FIG. 2, the air conditioning control device 50A includes: a measurement value acquisition unit 51; a cooling control content decision unit 52; a damper opening degree control unit 53; a coil drive control unit 54; a humidifier drive control unit 55; an air blow control content decision unit 56A; and a fan rotating speed control unit 57.

The measurement value acquisition unit 51 acquires measurement values measured by the return air thermometer 31, the outside air thermometer 32, the outside air hygrometer 33, the supply air thermometer 34, the supply air hygrometer 35 and the differential pressure gauge 36.

Based on the measurement values acquired by the measurement value acquisition unit 51, the cooling control content decision unit 52 decides the opening degrees of the exhausting damper 21, the return air introducing damper 22 and the outside air introducing damper 23, a drive content such as a necessary refrigerant amount of the cooling coil 24, and a drive content of the humidifier 25.

The damper opening degree control unit 53 creates control signals for setting the opening degrees of the exhausting damper 21, the return air introducing damper 22 and the outside air introducing damper 23 at opening degrees decided by the cooling control content decision unit 52, and transmit the created control signals to the respective dampers.

The coil drive control unit 54 creates a control signal for driving the cooling coil 24 to taken in the refrigerant from the outdoor machine 40 in accordance with the content decided by the cooling control content decision unit 52, and transmits the created control signal to the cooling coil 24.

The humidifier drive control unit 55 generates a control signal for driving the humidifier 25 in accordance with the content decided by the cooling control content decision unit 52, and transmits the created control signal to the humidifier 25.

As shown in FIG. 3, the air blow control content decision unit 56A includes: a differential pressure determination unit 561; a first PID control unit 562; a first upper/lower limiter 563; and a number-of-rotations setting unit 564.

The differential pressure determination unit 561 acquires the differential pressure, which is measured by the differential pressure gauge 36, from the measurement value acquisition unit 51, and then, based on this differential pressure, determines in which area between the cold area 12 and the hot area 13 and to which extent the static pressure is higher.

Here, in the case of using the differential pressure gauge capable of measuring the positive pressure and the negative pressure, the differential pressure determination unit 561 determines in which area and to which extent, the static pressure is higher, for example, based on whether or not the differential pressure of the cold area 12 to the hot area 13 is a positive value (positive pressure) (the static pressure of the cold area 12 is higher than the static pressure of the hot area 13), or based on whether or not the differential pressure of the cold area 12 with respect to the hot area 13 is a negative value (negative pressure) (the static pressure of the hot area 13 is higher than the static pressure of the cold area 12).

Meanwhile, in the case of using two differential pressure gauges 36 which can only measure the positive pressure, a difference between the differential pressures of these two gauges ($\Delta P = dp1 - dp2$; $dp1 \geq 0$, $dp2 \geq 0$) is taken, whereby in which area and to which extent the static pressure is higher are determined.

Based on results determined in the differential pressure determination unit 561, the first PID control unit 562 outputs a control setting value for changing the rotating speed of the air supply fan 26 according to needs so that the air of the cold area 12 can surely flow into the hot area 13. At this time, in this embodiment, a reference value for deciding whether or not to change the rotating speed of the air supply-fan 26 is set at a differential pressure "0". In such a way, when it is determined that the differential pressure of the hot area 13 with respect to the cold area 12 is higher than this reference value "0" (the static pressure of the hot area 13 is higher than the static pressure of the cold area 12), a target value of the differential pressure is set at this reference value "0", and there is outputted such a control setting value that reduces the rotating speed of the air supply fan 26 than at present in order to lower the static pressure of the hot area 13 based on the set reference value "0".

For the purpose of preventing the rotating speed of the air supply fan 26 from being suddenly changed and of performing smooth control, the first upper/lower limiter 563 restricts an absolute value of a variation range of the control setting value outputted by the first PID control unit 562 so that the absolute value concerned cannot become larger than a preset threshold value. Specifically, when the control setting value with a larger variation range than the threshold value is outputted in the first PID control unit 562, a value of a smaller variation range than this threshold value is created and outputted as the control setting value.

The rotating speed setting unit 564 sets the rotating speed of the air supply fan 26 based on the control setting value, which is outputted in the first PID control unit 562 and has passed through the restriction by the first upper/lower limiter 563.

The fan rotating speed control unit 57 creates a control signal for driving the air supply fan 26 at the rotating speed, which is decided by the air blow control content decision unit 56A, and transmits the created control signal to the air supply-fan 26.

(Operations of Server Room Managing Air Conditioning System According to First Embodiment)

Next, a description is made of operations of the server room managing air conditioning system 1A according to this embodiment.

For the purpose of appropriately cooling the servers installed in the server rack 11, the air conditioning system 1A in this embodiment is operated: (1) so that the cold air (supply air supplied from the indoor machine 20 to the server room 10) sucked by the fans in the servers can satisfy predetermined conditions; and (2) so that the fans in the servers can be capable of surely sucking the cold air in the cold area and blowing out the cold air to the hot area.

Between these, the conditions for the air supply in (1) are determined in response to a request from the installed servers. In this embodiment, conditions, where a temperature ranges from 18 to 27° C., an absolute humidity ranges from 0.0056 to 0.0107 kg/kg, and a relative humidity is 60% or less, are set in conformity with regulations of ASHRAE (American Society of Heating, Refrigerating and Air-Conditioning Engineers) or with regulations similar thereto.

In this embodiment, when the air conditioning system 1A is activated, the measurement values measured in the return air thermometer 31, the outside air thermometer 32, the outside air hygrometer 33, the supply air thermometer 34, the supply air hygrometer 35 and the differential pressure gauge 36 are individually transmitted to the air conditioning control device 50A.

The transmitted measurement values are acquired by the measurement value acquisition unit 51 of the air conditioning control device 50A, and these are transmitted to the cooling control content decision unit 52 and the air blow control content decision unit 56A.

In the cooling control content decision unit 52, based on the measurement values acquired by the measurement value acquisition unit 51, the opening degrees of the exhausting damper 21, the return air introducing damper 22 and the outside air introducing damper 23, the drive content such as the necessary refrigerant amount of the cooling coil 24, and the drive content of the humidifier 25, all of which are for generating the supply air under the above-mentioned conditions, are decided.

For the control for the opening degrees of the exhausting damper 21, the return air introducing damper 22 and the outside air introducing damper 23, the control for the drive of the cooling coil 24, and the control for the drive of the humidifier 25, all of which are for generating the supply air satisfying the above-described conditions, for example, there can be used an air conditioning system and a control method, which are described in Japanese Patent Application No. 2010-112560.

Next, in the damper opening degree control unit 53, control signals for setting the opening degrees of the exhausting damper 21, the return air introducing damper 22 and the outside air introducing damper 23 at the opening degrees decided by the cooling control content decision unit 52 are created, and are transmitted to the respective dampers.

Moreover, in the coil drive control unit 54, there is created a control signal for taking in the refrigerant from the outdoor machine 40 to the cooling coil 24 and driving the cooling coil 24 in accordance with the content decided by the cooling control content decision unit 52, and then the control signal is transmitted to the cooling coil 24.

Moreover, in the humidifier drive control unit 55, a control signal for driving the humidifier 25 in accordance with the content decided by the cooling control content decision unit 52 is created, and then the control signal is transmitted to the humidifier 25.

In the exhausting damper 21, the return air introducing damper 22, the outside air introducing damper 23, the cooling coil 24 and the humidifier 25, the drives thereof are executed, based on the control signals transmitted thereto.

As described above, the drives of the exhausting damper 21, the return air introducing damper 22, the outside air introducing damper 23, the cooling coil 24 and the humidifier 25 are controlled, whereby the supply air, which satisfies the above-mentioned condition of (1), is generated, and the servers installed in the server rack 11 of the server room 10 are cooled appropriately.

Moreover, in the air blow control content decision unit 56A, based on the measurement values acquired by the measurement value acquisition unit 51, the rotating speed of the air supply fan 26 is decided, which is for operating the air conditioning system 1A so that the fans in the servers can surely suck the cold air in the cold area and blow out the cold air to the hot area as mentioned above in (2).

Figure 4:
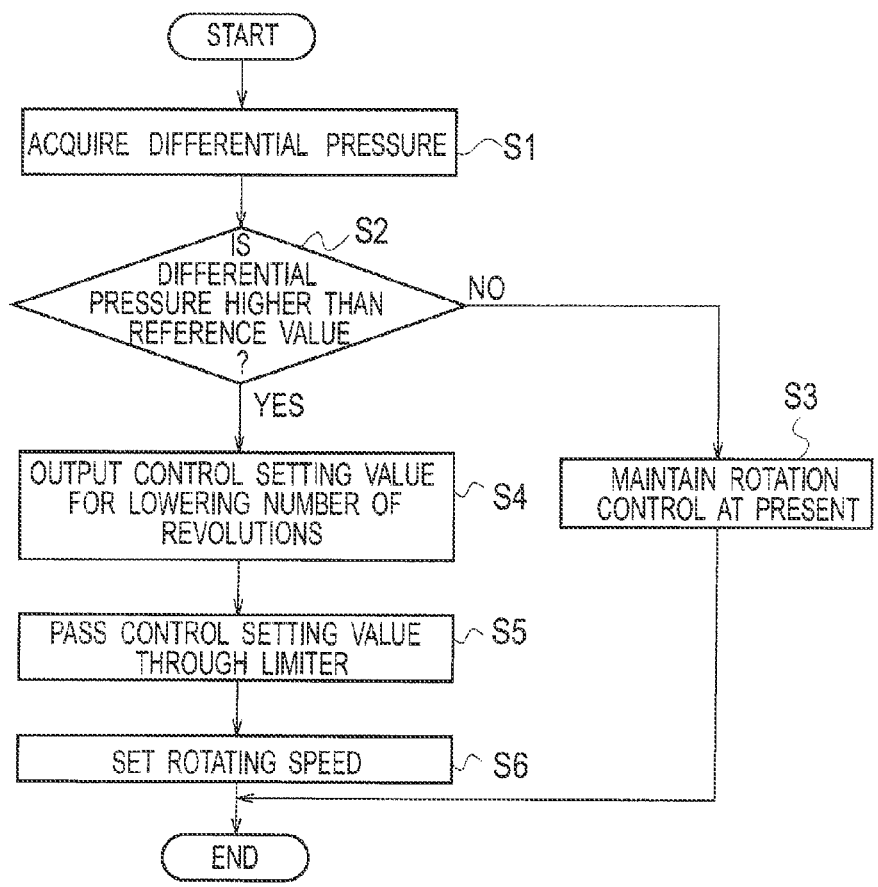
FIG. 4 is a flowchart showing operations of the air blow control content decision unit of the air conditioning control device of the air conditioning system according to the first embodiment.

With reference to FIG. 4, a description is made of operations when the rotating speed of the air supply fan 26 is decided by the air blow control content decision unit 56A in order to satisfy the above-described conditions of (2).

First, the differential pressure measured by the differential pressure gauge 36 is acquired in the differential pressure determination unit 561 (S1), and it is determined whether or not this differential pressure exceeds the preset reference value "0" (S2).

Here, when it is determined that the static pressure of the cold area 12 is higher than the static pressure of the hot area 13, and that the differential pressure does not exceed the reference value ("NO" in S2), such rotation control for the air supply fan 26, which is executed at present, is continued (S3).

Meanwhile, when the static pressure of the hot area 13 is higher than the static pressure of the cold area 12, and the differential pressure exceeds the reference value ("YES" in S2), then for the purpose of preventing the air from flowing from the hot area 13 into the cold area 12 and allowing the air conditioning to be appropriately performed, there is outputted, by the first PID control unit 562, a control setting value for setting the target value of the differential pressure at the reference value "0" and reducing the rotating speed of the air supply fan 26 than that at present (S4).

Next, for the purpose of nestling the rotating speed of the air supply fan 26 within a range of upper and lower limits, the control setting value outputted by the first PID control unit 562 is passed through the first upper/lower limiter 563, whereby the control setting value is restricted so as not to depart from the preset upper/lower limit range (S5).

Next, by the rotating speed setting unit 564, the rotating speed of the air supply fan 26 is set based on the control setting value, which is outputted in the first PID control unit 562, and has passed through the restriction by the first upper/lower limiter 563 (S6).

Then, by the fan rotating speed control unit 57, the control signal for driving the air supply fan 26 at the rotating speed, which is decided by the rotating speed setting unit 564, is created, and is transmitted to the air supply fan 26. In the air supply fan 26, the drive thereof is executed based on the control signal transmitted from the fan rotating speed control unit 57.

In accordance with the above-described embodiment, the air conditioning system can be operated so that the fans in the servers can surely suck the cold air in the cold area and blow out the cold air to the hot area in a state where the cold air (supply air supplied from the indoor machine 20 to the server room 10) sucked by the fans in the servers satisfies the predetermined conditions, whereby air conditioning control with good drive efficiency and a high energy saving effect can be executed.

Second Embodiment (Configuration of Server Room Managing Air Conditioning System According to Second Embodiment)

Figure 5:
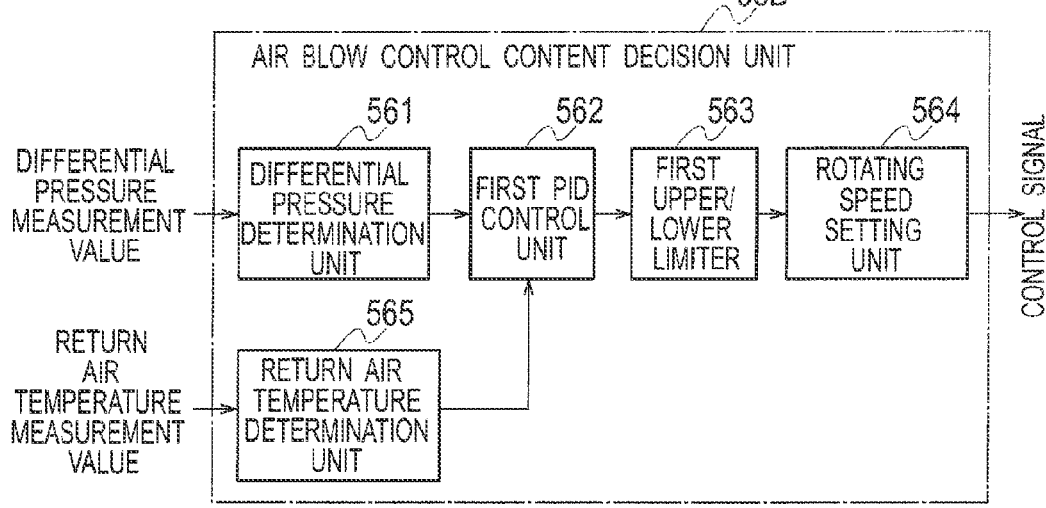
FIG. 5 is a block diagram showing a configuration of an air blow control content decision unit of an air conditioning control device of an air conditioning system according to a second embodiment.

A description is made of a configuration of a server room managing air conditioning system 1B according to a second embodiment of the present invention with reference to FIG. 1, FIG. 2 and FIG. 5.

In a similar way to the air conditioning system 1A shown in FIG. 1, the air conditioning system 1B according to this embodiment performs the air conditioning for the server room 10. The air conditioning system 1B includes: the indoor machine 20; the outdoor machine 40; and an air conditioning control device 50B.

Functions of the indoor machine 20 and the outdoor machine 40 are similar to functions of these in the air conditioning control device 50A, which are described in the first embodiment, and accordingly, a detailed description thereof is omitted.

As shown in FIG. 2, the air conditioning control device 50B according to this embodiment includes: the measurement value acquisition unit 51; the cooling control content decision unit 52; the damper opening degree control unit 53; the coil drive control unit 54; the humidifier drive control unit 55; an air blow control content decision unit 56B; and the fan rotating speed control unit 57.

Among them, functions of the measurement value acquisition unit 51, the cooling control content decision unit 52, the damper opening degree control unit 53, the coil drive control unit 54, the humidifier drive control unit 55 and the fan rotating speed control unit 57 are similar to the functions of these of the air conditioning control device 50A, which are described in the first embodiment, and accordingly, a detailed description thereof is omitted.

As shown in FIG. 5, the air blow control content decision unit 56B includes: the differential pressure determination unit 561; the first PID control unit 562; the first upper/lower limiter 563; the number-of-rotations setting unit 564; and a return air temperature determination unit 565.

Among them, functions of the first upper/lower limiter 563 and the number-of-rotations setting unit 564 are similar to the functions of these of the air blow control content decision unit 56A, which are described in the first embodiment, and accordingly, a detailed description thereof is omitted.

The return air temperature determination unit 565 acquires the measurement value of the return air thermometer 31 from the measurement value acquisition unit 51, and determines whether or not a return air temperature is a preset threshold value or less. This threshold value is a value set as an index indicating whether or not the servers housed in the server rack 11 are cooled sufficiently to an extent of being normally operable.

Based on the differential pressure between the cold area 12 and the hot area 13, which is measured in the differential pressure determination unit 561, and on results determined in the return air temperature determination unit 565, the first PID control unit 562 outputs a control setting value for the rotating speed of the air supply fan 26, which serves for allowing the air of the cold area 12 to surely flow into the hot area 13, and for setting the return air temperature at the threshold value concerned or less.

Specifically, when it is determined in the return air temperature determination unit 565 that the return air temperature does not exceed the preset threshold value, then in a similar way to the first embodiment, the reference value for deciding whether or not to change the rotating speed of the air supply fan 26 is set as the differential pressure "0". Moreover, when it is determined that the differential pressure of the hot area 13 with respect to the cold area 12 is higher than this reference value "0", the target value of the differential pressure is set at this reference value "0". Moreover, when it is determined that the return air temperature exceeds the preset threshold value, then the reference value for deciding whether or not to change the rotating speed of the air supply fan 26 is shifted and set at a differential pressure "P (P: a positive number larger than 0)". Furthermore, when it is determined that the differential pressure of the hot area 13 with respect the cola area 12 is higher than this reference value "P", the target pressure of the differential pressure is set at this reference value "P".

Then, when each of such target values is set as the reference value, then based on this reference value, such a control setting value as reducing the rotating speed of the air supply fan 26 than at present is outputted in order to lower the static pressure of the hot area 13.

(Operations of Server Room Managing Air Conditioning System According to Second Embodiment)

Next, a description is made of operations of the server room managing air conditioning system 1B according to this embodiment.

For the purpose of appropriately cooling the servers installed in the server rack 11, the air conditioning system 1B in this embodiment is operated: (1) so that the cold air (supply air supplied from the indoor machine 20 to the server room 10) sucked by the fans in the servers can satisfy predetermined conditions; (2) so that the fans in the servers can be capable of surely sucking the cold air in the cold area and blowing out the cold air to the hot area; and (3) so that a temperature of the warm air blown out by the fans in the servers can become a predetermined value or less.

Among them, as described in the first embodiment, for the conditions of the air supply in (1), the control for the opening degrees of the exhausting damper 21, the return air introducing damper 22 and the outside air introducing damper 23, the drive control for the cooling coil 24, and the drive control for the humidifier 25 are performed in conformity with the regulations of ASHRAE or with the regulations similar thereto.

In this embodiment, when the air conditioning system 1B is activated, the measurement values measured in the return air thermometer 31, the outside air thermometer 32, the outside air hygrometer 33, the supply air thermometer 34, the supply air hygrometer 35 and the differential pressure gauge 36 are individually transmitted to an air conditioning control device 50B.

The transmitted measurement values are acquired by a measurement value acquisition unit 51 of the air conditioning control device 50B, and these are transmitted to a cooling control content decision unit 52 and an air blow control content decision unit 56B.

In this embodiment, operations executed by the cooling control content decision unit 52, a damper opening degree control unit 53, a coil drive control unit 54 and a humidifier drive control unit 55 are similar to the operations of the cooling control content, decision unit 52 of the air conditioning control device 50A in the first embodiment, and accordingly, a detailed description thereof is omitted.

Moreover, in the air blow control content decision unit 56B, based on the measurement values acquired by the measurement value acquisition unit 51, the rotating speed of the air supply fan 26 is decided, which is for operating the air conditioning system 1B: so that the fans in the servers can surely suck the cold air in the cold area and blow out the cold air to the hot area as mentioned above in (2); and so that the temperature of the warm air blown out by the fans in the servers can become a predetermined value or less as mentioned above in (3).

Figure 6:
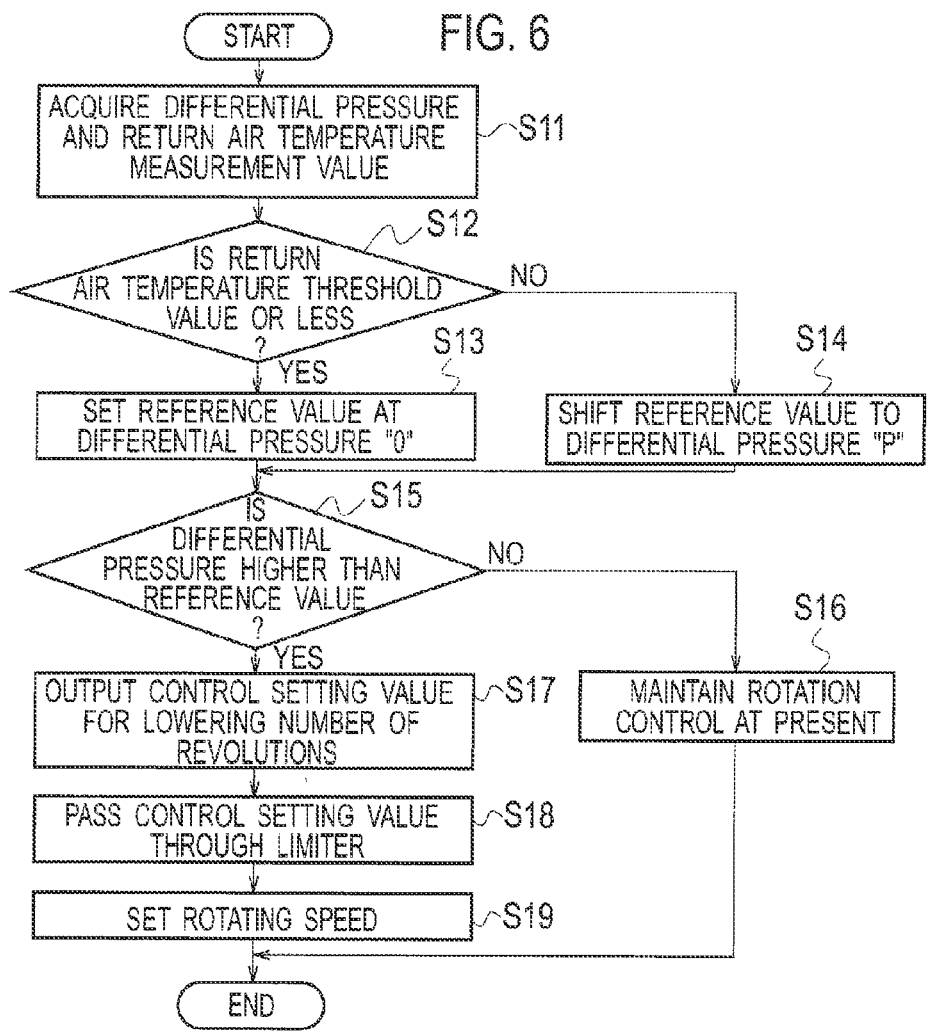
FIG. 6 is a flowchart showing operations of the air blow control content decision unit of the air conditioning control device of the air conditioning system according to the second embodiment.

With reference to FIG. 6, a description is made of operations when the rotating speed of the air supply fan 26 is decided by the air blow control content decision unit 56B in order to satisfy the above-described conditions of (2) and (3).

First, the differential pressure measured by the differential pressure gauge 36 is acquired in the differential pressure determination unit 561, and the return air temperature measurement value measured by the return air thermometer 31 is acquired in the return air temperature determination unit 565 (S11).

Then, in the return air temperature determination unit 565, it is determined whether or not the acquired return air temperature is a preset threshold value or less (S12).

Here, in the case where the return air temperature is the preset threshold value or less ("YES" in S12), it is determined that the servers housed in the server rack 11 are sufficiently cooled, and in a similar way to the case of the first embodiment, the reference value for deciding whether or not to change the rotating speed of the air supply fan 26 is set at "0" (S13).

Meanwhile, in the case where the return air temperature exceeds the preset, threshold value ("NO" in S12), it is determined that the servers housed in the server rack 11 are not sufficiently cooled, and the reference value for deciding whether or not to change the rotating speed of the air supply fan 26 is shifted and set at the differential pressure "P (P: a positive number larger than 0)" (S14). The reference value is shifted as described above, whereby it becomes possible to make the change toward an increase of the rotating speed of the air supply fan 25.

Next, it is determined whether or not the differential pressure acquired in the differential pressure determination unit 561 exceeds the reference value "0" or "P" (S15).

Here, when it is determined that the acquired differential pressure does not exceed the reference value ("NO" in S15), such rotation control for the air supply fan 26, which is executed at present, is continued (S16).

Meanwhile, when it is determined that the acquired differential pressure exceeds the reference value ("YES" in S15), then for the purpose of preventing the air from flowing from the hot area 13 into the cold area 12, allowing the air conditioning to be appropriately performed, and sufficiently cooling the servers, there is outputted, by the first PID control unit 562, a control setting value for setting the target value of the differential pressure at the reference value "0" or "P" and reducing the rotating speed of the air supply fan 26 than that at present (S17).

Next, for the purpose of preventing the rotating speed of the air supply fan 26 from being suddenly changed and of performing smooth control, the control setting value outputted by the first PID control unit 562 is passed through the first upper/lower limiter 563, whereby the absolute value of the variation range of the control setting value is restricted so as not to become larger than a preset threshold value (S18).

Next, based on the control setting value, which is outputted in the first PID control unit 562 and has passed through the restriction by the first upper/lower limiter 563, the rotating speed of the air supply fan 26 is set by the rotating speed, setting unit 564 (S19).

Then, by the fan rotating speed control unit 57, the control signal for driving the air supply fan 26 at the rotating speed, which is decided by the rotating speed setting unit 564, is created, and is transmitted to the air supply fan 26. In the air supply fan 26, the drive thereof is executed based on the control signal transmitted from the fan rotating speed control unit 57.

In accordance with the above-described embodiment, the air conditioning system can be operated so that the fans in the servers can surely suck the cold air in the cold area and blow out the cold air to the hot area in a state where the cold air (supply air supplied from the indoor machine 20 to the server room 10) sucked by the fans in the servers satisfies the predetermined conditions. Moreover, even in the case where a load on the servers is increased to raise the temperature of the hot area, this case can be coped with by making it easy to increase the rotating speed of the air supply fan, and the servers can be cooled sufficiently, whereby the air conditioning control with good drive efficiency and a high energy saving effect can be executed.

Third Embodiment (Configuration of Server Room Managing Air Conditioning System According to Third Embodiment)

Figure 7:
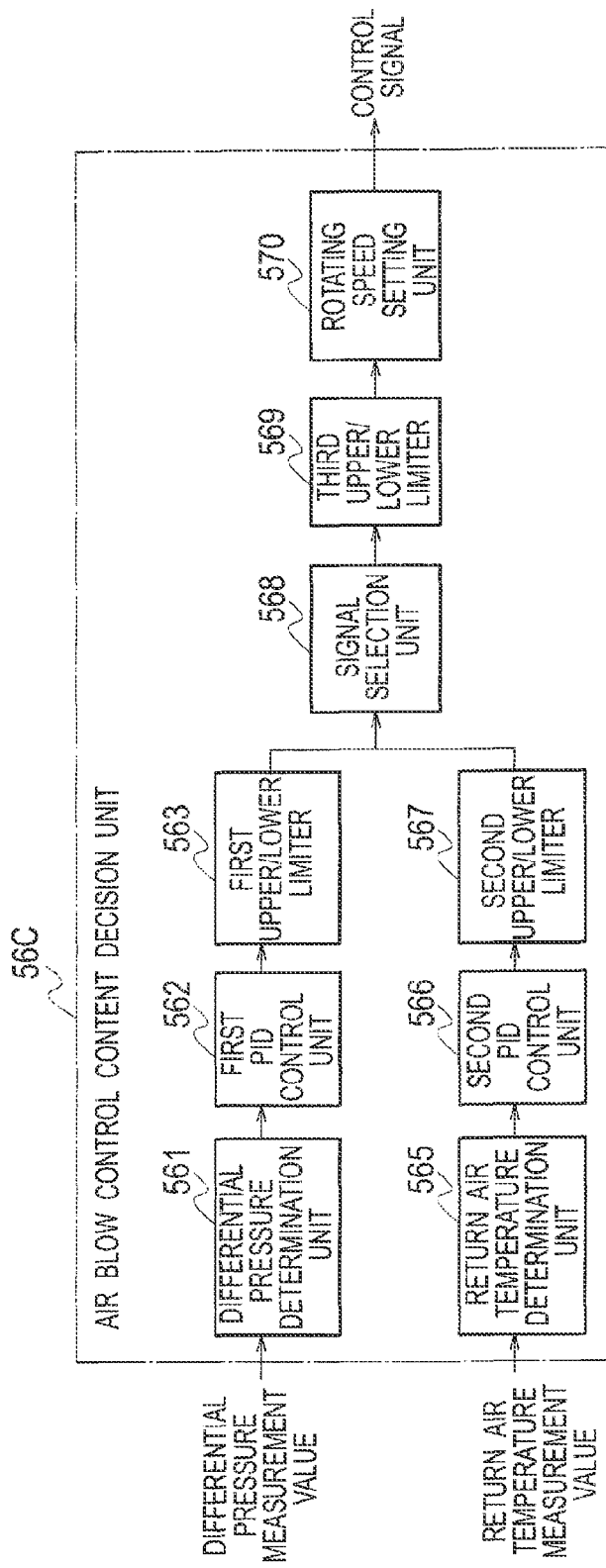
FIG. 7 is a block diagram showing a configuration of an air blow control content decision unit of an air conditioning control device of an air conditioning system according to a third embodiment.

A description is made of a configuration of a server room managing air conditioning system 1C according to a third embodiment of the present invention with reference to FIG. 1, FIG. 2 and FIG. 7.

In a similar way to the air conditioning systems 1A and 1B shown in FIG. 1, the air conditioning system 1C according to this embodiment performs the air conditioning for the server room 10. The air conditioning system 1C includes: the indoor machine 20; the outdoor machine 40; and an air conditioning control device 50C.

Functions of the indoor machine 20 and the outdoor machine 40 are similar to functions of these in the air conditioning control device 50A, which are described in the first embodiment, and accordingly, a detailed description thereof is omitted.

As shown in FIG. 2, the air conditioning control device 50C according to this embodiment includes: the measurement value acquisition unit 51; the cooling control content decision unit 52; the damper opening degree control unit 53; the coil drive control unit 54; the humidifier drive control unit 55; an air blow control content decision unit 56C; and the fan rotating speed control unit 57.

Among them, functions of the measurement value acquisition unit 51, the cooling control content decision unit 52, the damper opening degree control unit 53, the coil drive control unit 54, the humidifier drive control unit 55 and the fan rotating speed control unit 57 are similar to the functions of these in the air conditioning control device 50A, which are described in the first embodiment, and accordingly, a detailed description thereof is omitted.

As shown in FIG. 7, the air blow control content decision unit 56C includes: the differential pressure determination unit 561; the first PID control unit 562; the first upper/lower limiter 563; the return air temperature determination unit 565; a second PID control unit 566; a second upper/lower limiter 567; a signal selection unit 568; a third upper/lower limiter 569; and a rotating speed setting unit 570.

Among them, functions of the differential pressure determination unit 561, the first PID control unit 562, the first upper/lower limiter 563 are similar to the functions of these of the air blow control content decision unit 56A, which are described in the first embodiment, and accordingly, a detailed description thereof is omitted.

The return air temperature determination unit 565 acquires the measurement value of the return air thermometer 31 from the measurement value acquisition unit 51, and determines whether or not the return air temperature is a preset threshold value or less.

Based on results determined in the return air temperature determination unit 565, the second PID control unit 566 outputs a control setting value for the rotating speed of the air supply fan 26, which servers for sufficiently cooling the servers housed in the server rack 11. At this time, such a control setting value as follows is outputted: in the case where the return air temperature is the preset threshold value or less, it is determined than the servers are sufficiently cooled, and the rotating speed of the air supply fan 26 at present is maintained; and in the case where the return air temperature exceeds the preset, threshold value, it is determined that the load on the servers is increased and the servers are cooled insufficiently, and the rotating speed of the air supply fan 26 is increased in order to set the return air temperature at the threshold value or less.

For the purpose of preventing the rotating speed of the air supply fan 26 from being suddenly changed and of performing smooth control, the second upper/lower limiter 567 restricts an absolute value of a variation range of the control setting value outputted by the second PID control unit 566 so that the absolute value concerned cannot become larger than a preset threshold value. Specifically, when the control setting value larger than the threshold value is outputted in the second PID control unit 566, a value smaller than this threshold value is created and outputted as the control setting value.

The signal selection unit 568 compares the control setting value, which has passed through the first upper/lower limiter, and the control setting value, which has passed through the second, upper/lower limiter, with each other, and selects the control setting value with a larger absolute value.

The third upper/lower limiter 569 restricts the absolute value of the variation range of the control setting value selected by the signal selection unit 568 so that the absolute value concerned cannot become a preset threshold value. Specifically, when the control setting value selected by the signal selection unit 568 is a value larger than the threshold value, a value smaller than this threshold value is created and outputted as the control setting value.

Based on the control setting value, which is selected by the signal selection unit 568 and has passed through the restriction by the third upper/lower limiter 569, the rotating speed setting unit 570 sets the rotating speed of the air supply-fan 26.

(Operations of Server Room Managing Air conditioning System According to Third Embodiment)

Next, a description is made of operations of the server room managing air conditioning system 1C according to this embodiment.

For the purpose of appropriately cooling the servers installed in the server rack 11, the air conditioning system 1C in this embodiment is operated: (1) so that the cold air (supply air supplied from the indoor machine 20 to the server room 10) sucked by the fans in the servers can satisfy predetermined conditions; (2) so that the fans in the servers can be capable of surely sucking the cold air in the cold area and blowing out the cold air to the hot area; and (3) so that the temperature of the warm air blown out by the fans in the servers can become a predetermined value or less.

Among them, as described in the first embodiment, for the conditions of the air supply in (1), the control for the opening degrees of the exhausting damper 21, the return air introducing damper 22 and the outside air introducing damper 23, the drive control for the cooling coil 24, and the drive control for the humidifier 25 are performed in conformity with the regulations of ASHRAE or with the regulations similar thereto.

In this embodiment, when the air conditioning system 1C is activated, the measurement values measured in the return air thermometer 31, the outside air thermometer 32, the outside air hygrometer 33, the supply air thermometer 34, the supply air hygrometer 35 and the differential pressure gauge 36 are individually transmitted to an air conditioning control device 50C.

The transmitted measurement values are acquired by a measurement value acquisition unit 51 of the air conditioning control device 50C, and these are transmitted to a cooling control content decision unit 52 and an air blow control content decision unit 56C.

In this embodiment, operations executed by the cooling control content decision unit 52, a damper opening degree control unit 53, a coil drive control unit 54 and a humidifier drive control, unit 55 are similar to the operations of the cooling control, content decision unit 52 of the air-conditioning control device 50A in the first embodiment, and accordingly, a detailed description thereof is omitted.

Moreover, in the air blow control content decision unit 56C, based on the measurement values acquired by the measurement value acquisition unit 51, the rotating speed of the air supply fan 26 is decided, which is for operating the air conditioning system 1C: so that the fans in the servers can surely suck the cold air in the cold area and blow out the cold air to the hot area as mentioned above in (2); and so that the temperature of the warm, air blown out by the fans in the servers can become a predetermined value or less as mentioned above in (3).

Figure 8:
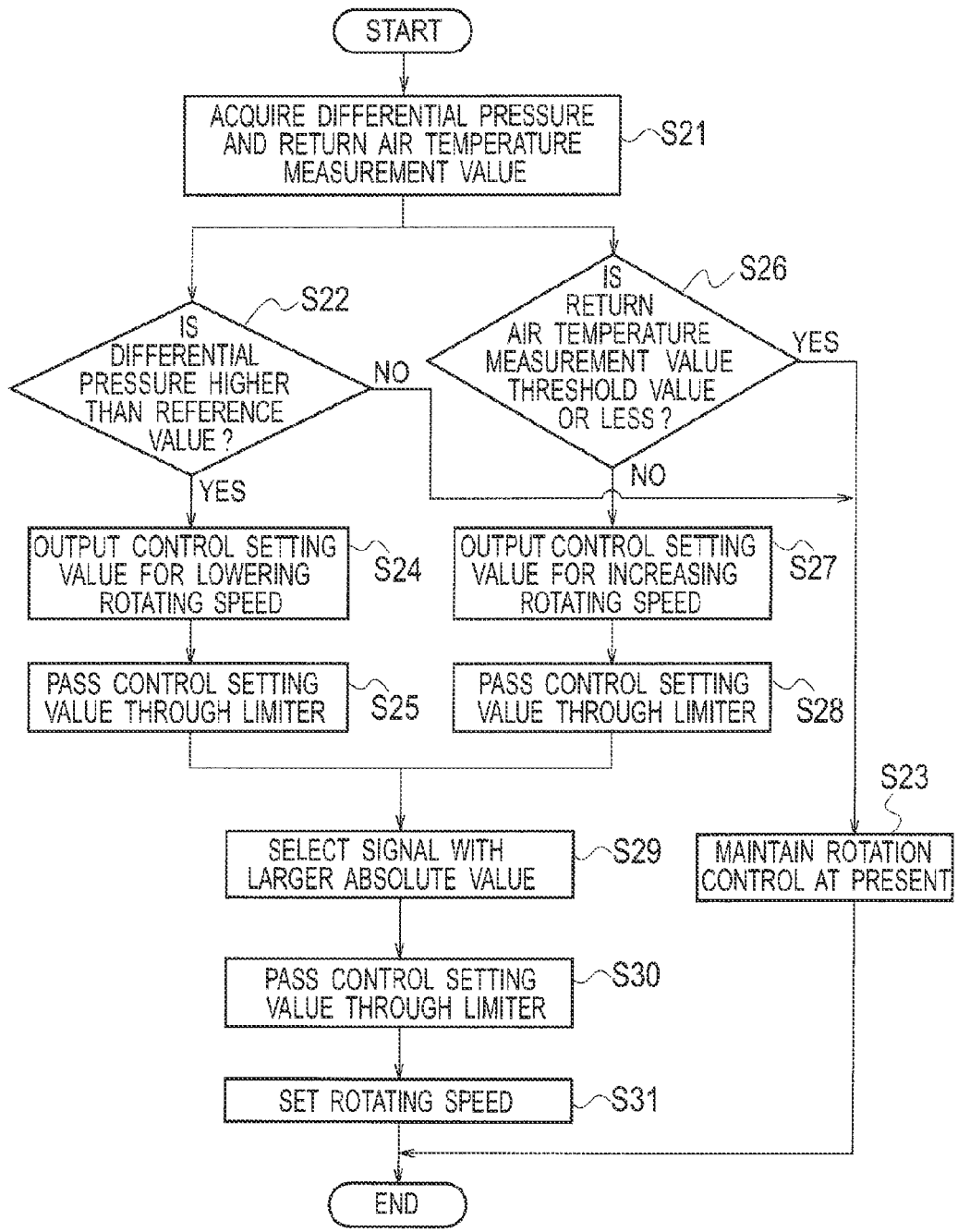
FIG. 8 is a flowchart showing operations of the air blow control content decision unit of the air conditioning control device of the air conditioning system according to the third embodiment.

With reference to FIG. 8, a description is made of operations when the rotating speed of the air supply fan 26 is decided by the air blow control content decision unit 56C in order to satisfy the above-described, conditions of (2) and (3).

First, the differential pressure measured by the differential pressure gauge 36 is acquired in the differential pressure determination unit 561, and the return air temperature measurement value measured by the return air thermometer 31 is acquired in the return air temperature determination unit 565 (S21).

Then, in the differential pressure determination unit 561, it is determined whether or not the acquired differential pressure exceeds the reference value "0" (S22).

Here, when it is determined that the static pressure of the cold area 12 is higher than the static pressure of the hot area 13, and that the differential pressure does not exceed the reference value ("NO" in S22), the such rotation control for the air supply fan 26, which is executed at present, is continued (S23).

Meanwhile, when the static pressure of the hot area 13 is higher than the static pressure of the cold area 12, and the differential pressure exceeds the reference value ("YES" in S22), then for the purpose of preventing the air from flowing from the hot area 13 into the cold area 12 and allowing the air conditioning to be appropriately performed, there is outputted, by the first PID control unit 562, a control setting value for setting the target value of the differential pressure at the reference value "0" and reducing the rotating speed of the air supply fan 26 than that at present (S24).

Next, for the purpose of preventing the rotating speed of the air supply fan 26 from being suddenly changed and of performing smooth control, the control setting value outputted by the first PID control unit 562 is passed through the first upper/lower limiter 563, whereby the absolute value of the variation range of the control setting value is restricted so as not to become larger than a preset threshold value (S25).

Meanwhile, in the return air temperature determination unit 565, it is determined whether or not the return air temperature acquired in Step S21 is a preset threshold value or less (S26).

Here, in the case where the return air temperature is the preset threshold value or less ("YES" in S26), it is determined that the servers housed in the server rack 11 are sufficiently cooled, and the such rotation control for the air supply fan 26, which is executed at present, is continued (S23).

Meanwhile, in the case where the return air temperature exceeds the preset, threshold value ("NO" in S26), it is determined, that the servers housed in the server rack 11 are cooled insufficiently, and a control setting value for increasing the rotating speed of the air supply fan 26 than that at present is outputted in order to set the return air temperature at the threshold value concerned or less (S27).

Next, for the purpose of preventing the rotating speed of the air supply fan 26 from being suddenly changed and of performing smooth control, the control setting value outputted by the second PID control unit 566 is passed through the second upper/lower limiter 567, whereby the control setting value is restricted so as not to depart from the preset upper/lower limit range (S28).

Next, in the signal selection unit 568, the control setting value, which has passed through the first upper/lower limiter, and the control setting value, which has passed through the second upper/lower limiter, are compared with each other, and the control setting value with a larger absolute value is selected (S29).

Next, in the third upper/lower limiter 569, the absolute value of the variation range of the control setting value selected by the signal selection unit 568 is restricted so as not to become larger than a preset threshold value (S30).

Next, based on the control setting value, which is selected by the signal selection unit 568 and has passed through the restriction by the third upper/lower limiter 569, the rotating speed of the air supply fan 26 is set by the rotating speed setting unit 570 (S31).

In accordance with the above-described embodiment, the air conditioning system can be operated so that the fans in the servers can surely suck the cold air in the cold area and blow out the cold air to the hot area in a state where the cold air (supply air supplied from, the indoor machine 20 to the server room 10) sucked by the fans in the servers satisfies the predetermined conditions. Moreover, even in the case where the load on the servers is increased to raise the temperature of the hot area, this case can be coped with, and the servers can be cooled sufficiently, whereby the air conditioning control with good drive efficiency and a high energy saving effect can be executed.

Fourth Embodiment (Configuration of Server Room Managing Air Conditioning System According to Fourth Embodiment)

Figure 9:
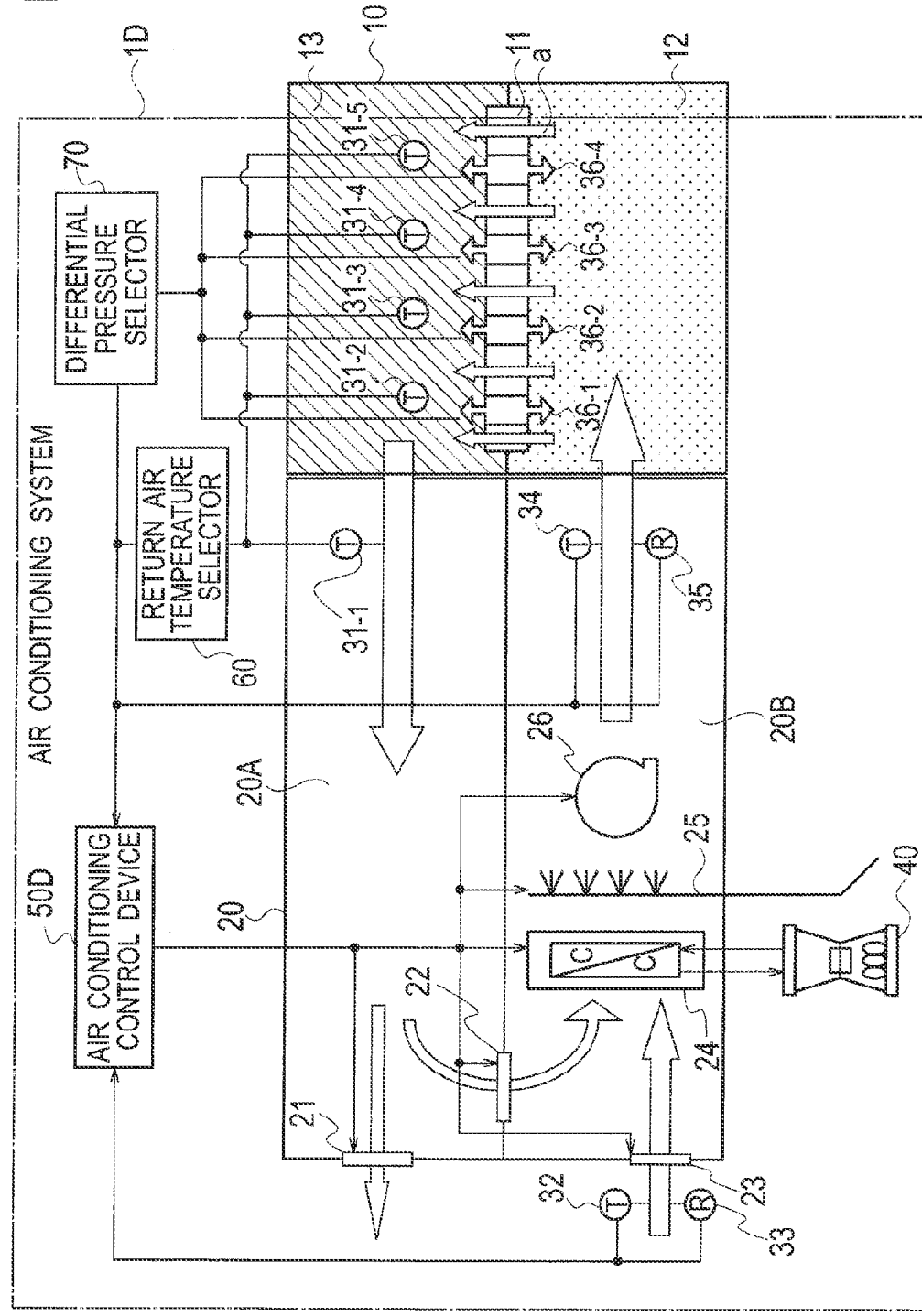
FIG. 9 is an overall view showing a configuration of an air conditioning system according to a fourth embodiment.

A description is made of a configuration of a server room managing air conditioning system 1D according to a fourth embodiment of the present invention with reference to FIG. 9.

In a similar way to the air conditioning system 1A shown in FIG. 1, the air conditioning system 1D according to this embodiment performs the air conditioning for the server room 10. The air conditioning system 1D includes: the indoor machine 20; the outdoor machine 40; and an air conditioning control device 50D.

Functions of the indoor machine 20 and the outdoor machine 40 are similar to functions of these in the air-conditioning control device 50A, which are described in the first embodiment, and accordingly, a detailed description thereof is omitted.

The configuration of the air conditioning control device 50D is similar to that of any of the air conditioning control devices 50A to 50C, and accordingly, a detailed description of constituent, portion having the same functions is omitted.

Moreover, in this embodiment, there are installed a plurality of return air thermometers 31-1 to 31-5 which measure return air temperatures at different spots in the return air-suction area 20A and in the hot area 13 of the server room 10, for example, spots corresponding to the respective servers or rack rows in the server rack 11.

Furthermore, in the air conditioning system 1, a return air temperature selector 60 is installed, which selects a highest measurement value among return air temperature measurement values measured by these return air thermometers 31-1 to 31-5, and transmits the highest measurement value to the air conditioning control device 50D.

Moreover, in the server room 10, there are installed a plurality of differential pressure gauges 36-1 to 36-4 which measure the differential pressure as the difference in static pressure between the cold area 12 and the hot area 13 at different spots.

Furthermore, in the air conditioning 1. a differential pressure selector 70 is installed, which selects a smallest differential pressure among the differential pressures measured by these differential pressure gauges 36-1 to 36-4, and transmits the smallest differential pressure to the air conditioning control device 50D.

Then, in a measurement value acquisition unit 51 of the air conditioning control device 50D, there are acquired: the measurement values measured by the outside air thermometer 32, the outside air hygrometer 33, the supply air thermometer 34 and the supply air hygrometer 35; the return air temperature measurement value selected by the return air temperature selector 60; and the differential pressure selected by the differential pressure selector 70.

(Operations of Server Room Managing Air Conditioning System According to Fourth Embodiment)

Next, a description is made of operations of the server room managing air conditioning system 1D according to this embodiment.

For the purpose of appropriately cooling the servers installed in the server rack 11, the air conditioning system 1D in this embodiment is operated: (1) so that the cold air (supply air supplied from the indoor machine 20 to the server room 10) sucked by the fans in the servers can satisfy predetermined conditions; (2) so that the fans in the servers can be capable of surely sucking the cold air in the cold area and blowing out the cold air to the hot area; and (3) so that the temperature of the warm air blown out by the fans in the servers can become a predetermined value or less.

Among them, as described in the first embodiment, for the conditions of the air supply in (1), the control for the opening degrees of the exhausting damper 21, the return air introducing damper 22 and the outside air introducing damper 23, the drive control for the cooling coil 24, and the drive control for the humidifier 25 are performed in conformity with the regulations of ASHRAE or with the regulations similar thereto.

In this embodiment, when the air conditioning system ID is activated, the return air temperature measurement values measured by the return air thermometers 31-1 to 31-5 are transmitted to the return air temperature selector 60, and in the return air temperature selector 60, the highest measurement value among the acquired return air temperature measurement values is selected, and is then transmitted to the air conditioning control device 50D. Moreover, the differential pressures measured by the differential pressure gauges 36-1 to 36-4 are transmitted to the differential pressure selector 70, and in the differential pressure selector 70, the smallest differential pressure among the acquired differential pressures of the cold area 12 with respect to the hot area 13 is selected, and is then transmitted to the air conditioning control device 50D.

Moreover, the measurement values measured in the outside air thermometer 32, the outside air hygrometer 33, the supply air thermometer 34, and the supply air hygrometer 35 are individually transmitted to the air conditioning control device 50D.

The transmitted measurement values are acquired by a measurement value acquisition unit 51 of the air conditioning control device 50D, and these are transmitted to a cooling control content decision unit 52 and an air blow control content decision unit 56.

Then, in a similar way to the operations of the first embodiment, drive contents of the exhausting damper 21, the return air introducing damper 22, the outside air introducing damper 23, the cooling coil 24 and the humidifier 25 for the purpose of generating the supply air under the set conditions are decided by the cooling control content decision unit 52, and control signals for driving these instruments in accordance with the decided contents are created in the damper opening degree control unit 53, the coil drive control unit 54 and the humidifier drive control unit 55, and are transmitted to the respective instruments.

Furthermore, in a similar way to the operations of the second, embodiment or the third embodiment, by the air blow control content decision unit 56, there is decided the rotating speed of the air supply fan 26, which is for operating the air conditioning system 1D: (2) so that the fans in the servers can surely suck the cold air in the cold area and blow out the cold air to the hot area; and (3) so that the temperature of the warm air blown out by the fans in the servers can become a predetermined value or less. Then, a control signal for rotating the air supply fan 26 at the decided rotating speed is created in the fan rotating speed control unit 57, and is transmitted to the air supply fan 26. In the air supply fan 26, the drive thereof is executed based on the control signal transmitted from the fan rotating speed control unit 57.

In accordance with this embodiment described above, even in the case where the loads are different among the servers or the server rack rows, the air conditioning system can be operated so that the fans in all of the servers can surely suck the cold air in the cold area and blow out the cold air to the hot area in a state where the cold air (supply air supplied from the indoor machine 20 to the server room 10) sucked by the fans in the servers satisfies the predetermined conditions. Moreover, even in the case where the load on any of the servers is increased to raise the temperature of the hot area, this case can be coped with, and all of the servers can be cooled sufficiently, whereby the air conditioning control with good drive efficiency and a high energy saving effect can be executed.

Fifth Embodiment (Configuration of Server Room Managing Air Conditioning System According to Fifth Embodiment)

Figure 10:
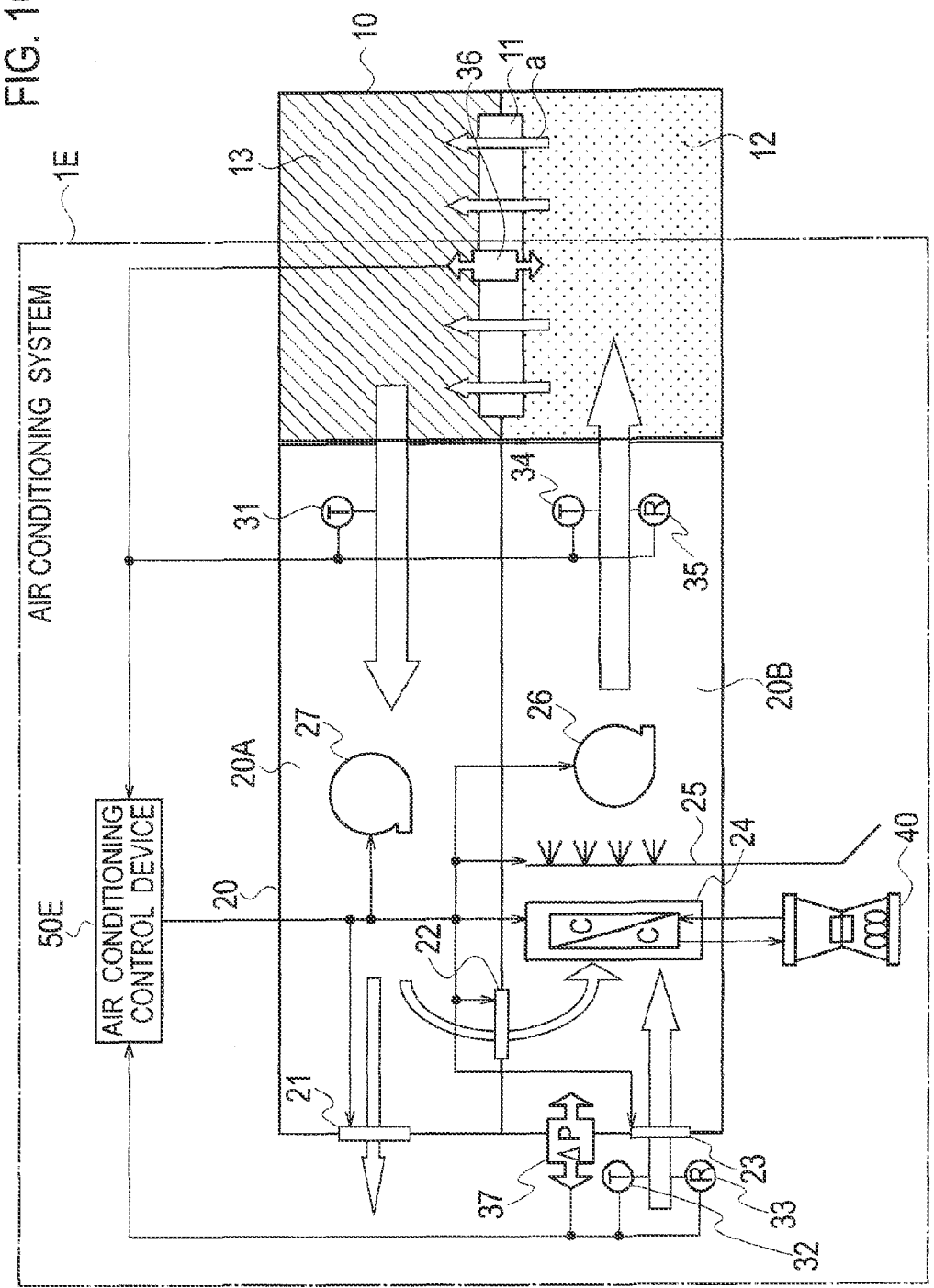
FIG. 10 is an overall view showing a configuration of an air conditioning system according to a fifth embodiment.

A description is made of a configuration of a server room managing air conditioning system 1E according to a fifth embodiment of the present invention with reference to FIG. 10.

The air conditioning system 1E according to this embodiment is similar in configuration to any of the air conditioning system 1A in the first embodiment to the air conditioning system 1D in the fourth embodiment except that an air return fan 27 that flows the return air from the hot area 13 of the server room 10 into the return air suction area 20A is installed in the return air suction area 20A, and that a differential pressure gauge 37, which measures a differential pressure as a difference in static pressure between the supply air cooling area 20B and the outside air, is installed between the supply air cooling area 20B and the outside air. Accordingly, a detailed description of portions having the same functions is omitted.

An air conditioning control device 50E is installed in the air conditioning system 1E according to this embodiment. As shown in FIG. 2, the air conditioning control device 50E includes: the measurement value acquisition unit 51; the cooling control content decision unit 52; the damper opening degree control unit 53; the coil drive control unit 54; the humidifier drive control unit 55; an air blow control content decision unit 56E; and the fan rotating speed control unit 57.

Among them, functions of the cooling control content decision unit 52, the damper opening degree control unit 53, the coil drive control unit 54 and the humidifier drive control unit 55 are similar to the functions of these in the air conditioning control device 50A, which are described in the first embodiment, and accordingly, a detailed description thereof is omitted.

The measurement value acquisition unit 51 in this embodiment acquires a measurement value measured by the differential pressure gauge 37, and transmits the acquired measurement value to the air blow control content decision unit 56.

Moreover, the air blow control content decision unit 56E in this embodiment has a configuration for controlling the rotating speed of the air return fan 27 in addition to the configuration of any of the air blow control content decision units 56A to 56C.

Figure 11:
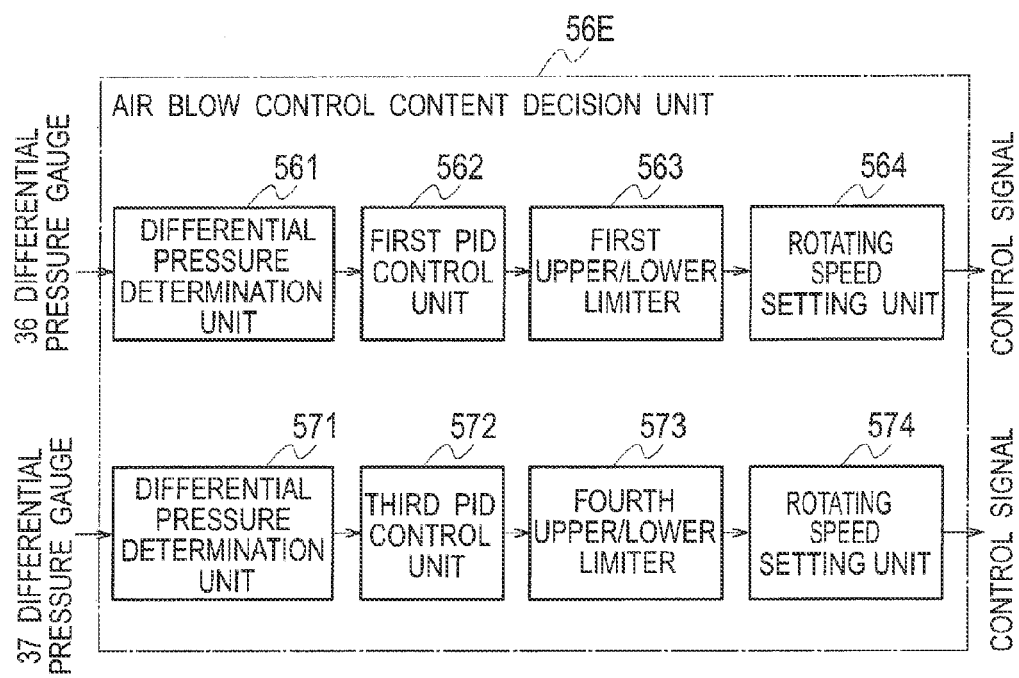
FIG. 11 is a block diagram showing a configuration of an air blow control content decision unit of an air conditioning control device of an air conditioning system according to a fifth embodiment.

FIG. 11 shows a block diagram in the case where, as an example of the air blow control content decision unit 56E, the configuration for controlling the rotating speed of the air return fan 27 is added to the configuration of the air blow control content decision unit 56A.

The air blow control content decision unit 56E in FIG. 11 includes: the differential pressure determination unit 561, the first PID control unit 562, the first upper/lower limiter 563, and the rotating speed setting unit 564, which control the rotating speed of the air supply fan 26 based on the measurement value of the differential pressure gauge 36; and a differential pressure determination unit 571, a third PID control unit 572, a fourth upper/lower limiter 573, and a rotating speed setting unit 574, which control the rotating speed of the air return fan 27 based on the measurement value of the differential pressure gauge 37.

The differential pressure determination unit 571 acquires the differential pressure, which is measured by the differential pressure gauge 37, from the measurement value acquisition unit 51, and then, based on this differential pressure, determines in which area between the supply air cooling area 20B and the outside air and to which extent the static pressure is higher.

Based on results determined in the differential pressure determination unit 571, the third PID control unit 572 outputs a control setting value for increasing the rotating speed of the air return fan 27 according to needs so that the outside air cannot leak in the supply air cooling area 20B. Here, the reference value for deciding whether or not to change the rotating speed of the air return fan 27 is set at the differential pressure "0". In such a way, when it is determined that the differential pressure of the outside air with respect to the supply air cooling area 20B is higher than this reference value "0" (the static pressure of the outside air is higher than the static pressure of the supply air cooling area 20B), a target value of the differential pressure is set at this reference value "0", and there is outputted such a control setting value that increases the rotating speed of the air return fan 27 than at present in order to raise the static pressure of the supply air cooling area 20B based on the set reference value "0".

For the purpose of preventing the rotating speed of the air return fan 27 from being suddenly changed and of performing smooth control, the fourth upper/lower limiter 573 restricts an absolute value of a variation range of the control setting value outputted by the third PID control unit 572 so that the absolute value concerned cannot become larger than a preset threshold value. Specifically, when the control setting value with a larger variation range than the threshold value is outputted in the third PID control unit 572, a value of a smaller variation range than this threshold value is created and outputted as the control setting value.

The rotating speed setting unit 574 sets the rotating speed of the air return fan 27 based on the control setting value, which is outputted in the third PID control unit 572 and has passed through the restriction by the fourth upper/lower limiter 573.

The fan rotating speed control unit 57 creates a control signal for driving each of the air supply fan 26 and the air return fan 27 at the rotating speed, which is decided by the air blow control content decision unit 56E, and transmits the created control signal to each of the air supply fan 26 and the air return fan 27.

(Operations of Server Room Managing Air Conditioning System According to Fifth Embodiment)

Next, a description is made of operations of the server room managing air conditioning system 1E according to this embodiment.

For the purpose of appropriately cooling the servers installed in the server rack 11, the air conditioning system 1E in this embodiment is operated: (1) so that the cold air (supply air supplied from the indoor machine 20 to the server room 10) sucked by the fans in the servers can satisfy predetermined conditions; (2) so that the fans in the servers can be capable of surely sucking the cold air in the cold area and blowing out the cold air to the hot area; and (4) so that the outside air cannot leak in the air conditioning control device.

In this embodiment, when the air conditioning system 1E is activated, the measurement values measured in the return air thermometer 31, the outside air thermometer 32, the outside air hygrometer 33, the supply air thermometer 34, the supply air hygrometer 35, the differential pressure gauge 36 and the differential pressure gauge 37 are individually transmitted to the air conditioning control device 50E.

The transmitted measurement values are acquired by the measurement value acquisition unit 51 of the air conditioning control device 50D, and these are transmitted to the cooling control content decision unit 52 and the air blow control content decision unit 56.

Then, in a similar way to the operations of the first embodiment, drive contents of the exhausting damper 21, the return air introducing damper 22, the outside air introducing damper 23, the cooling coil 24 and the humidifier 25 for the purpose of generating the supply air under the set conditions are decided by the cooling control content decision unit 52, and control signals for driving these instruments in accordance with the decided contents are created in the damper opening degree control unit 53, the coil drive control unit 54 and the humidifier drive control unit 55, and are transmitted to the respective instruments.

Furthermore, in a similar way to the operations of the first embodiment to the third embodiment, in the differential pressure determination unit 561 to rotating speed setting unit 564 of the air blow control content decision unit 56, there is decided, the rotating speed of the air supply fan 26, which is for operating the air conditioning system 1E (2) so that the fans in the servers can surely suck the cold air in the cold area and blow out the cold air to the not area. Then, a control signal for rotating the air supply fan 26 at the decided rotating speed is created in the fan rotating speed control unit 57, and is transmitted to the air supply fan 26. In addition, in the differential pressure determination unit 571 to rotating speed setting unit 574 of the air blow control content decision unit 56, there is decided the rotating speed of the air return fan 27, which is for operating the air conditioning system 1E (4) so that the outside air cannot leak in the air conditioning control device. Then, a control signal for rotating the air return fan 27 at the decided rotating speed is created in the fan rotating speed control unit 57, and is transmitted to the air return fan 27.

A description is made of operations when the rotating speed of the air return fan 27 is decided by the air blow control content decision unit 56E in order to satisfy the above-described conditions of (4).

First, the differential pressure measured by the differential pressure gauge 37 is acquired in the differential pressure determination unit 571, and it is determined whether or not this differential pressure exceeds the preset reference value "0".

Here, when it is determined that the static pressure of the supply air cooling area 20B is higher than the static pressure of the outside air, and that the differential pressure does not exceed the reference value, such rotation control for the air supply fan 26, which is executed at present, is continued.

Meanwhile, when it is determined that the static pressure of the outside air is higher than the static pressure of the supply air cooling area 20B, and that the differential pressure exceeds the reference value, then for the purpose of preventing the air from leaking from the outside in the supply air cooling area 20B and allowing the air conditioning to be appropriately performed, there is outputted, by the third PID control unit 572, a control setting value for setting the target value of the differential pressure at the reference value "0" and increasing the rotating speed of the air return fan 27 than that at present.

Next, for the purpose of preventing the rotating speed of the air return fan 27 from being suddenly changed and of performing smooth control, the control setting value outputted by the third PID control unit 572 is passed through the fourth upper/lower limiter 573, whereby the absolute value of the variation range of the control setting value is restricted so as not to become larger than a preset threshold value.

Next, based on the control setting value, which is outputted in the third PID control unit 572 and has passed through the restriction by the fourth upper/lower limiter 573, the rotating speed of the air return fan 27 is set by the rotating speed setting unit 574.

Then, by the fan rotating speed control unit 57, the control signal for driving the air return fan 27 at the rotating speed, which is decided by the rotating speed setting unit 574, is created, and is transmitted to the air return fan 27. In the air return fan 26, the drive thereof is executed based on the control signal transmitted from the fan rotating speed control unit 57.

In accordance with this embodiment described above, the air conditioning system can be operated so that the fans in the servers can surely suck the cold air in the cold area and blow out the cold air to the hot area in a state where the cold air (supply air supplied from the indoor machine 20 to the server room 10) sucked by the fans in the servers satisfies the predetermined conditions, and the outside air does not leak in the air conditioning control device, whereby the air conditioning control with good drive efficiency and a high energy saving effect can be executed.

The description has been made of some embodiments of the present invention; however, these embodiments are illustrated as examples, and do not intend to limit the scope of the invention. It is possible to embody these novel embodiments in other various forms, and for the embodiments, varieties of omissions, substitutions and alternations can be performed within the scope without departing from the spirit of the invention. These embodiments and modifications thereof are incorporated in the scope and spirit of the invention, and in addition, incorporated in inventions described in the scope of claims and a range of equilibrium thereof.

The invention claimed is:

1. An air conditioning system for managing a server room, in which a server is installed between first and second spaces, and supply air flowed into the first space is heated by heat generation of the server, and flows out as return air via the second space, thereby to control air conditioning in the server room, the air conditioning system comprising:
   a cold air generation device that generates cold air satisfying a predetermined condition;
   an air supply fan that flows the cold air generated by the cold air generation device into the first space;
   a first differential pressure gauge that measures a differential pressure of a static pressure of the second space with respect to a static pressure of the first space;
   a return air thermometer that measures a temperature of the return air flowed out from the second space,
   a first control value decision unit that decides a first control value of a rotating speed of the air supply fan in order to prevent air from flowing from the second space to the first space based on the differential pressure measured by the first differential pressure gauge,
   a second control value decision unit that decides a second control value of the rotating speed of the air supply fan in order to lower a temperature of the return air when the temperature of the return air measured by the return air thermometer is higher than a set threshold value,
   a first output unit that outputs a control set value based on a larger control value between the first control value and the second control value,
   a first rotating speed control unit that controls based on the control set value output by the first output unit.

2. The air conditioning system for managing a server room according to claim 1, wherein a plurality of the first differential pressure gauges are installed,
   further comprising a differential pressure selector that selects a smallest differential pressure among differential pressures measured by the plurality of first differential pressure gauges,
   wherein the first control value decision unit decides the first control value based on the differential pressure selected by the differential pressure selector.

3. The air conditioning system for managing a server room according to either one of claims 1 and 2, wherein a plurality of the return air thermometers are installed, further comprising return air temperature selector that selects a highest return air temperature measurement value among return air temperature measurement values measured by the plurality of return air thermometers, wherein the second control value decision unit decides the second control value based on the return air temperature measurement value selected by the return air temperature selector.

4. The air conditioning system for managing a server room according to either one of claims 1 and 2, further comprising:

an air return fan that flows in return air from the second space of the server room; and a second differential pressure gauge that measures a differential pressure between a static pressure in the air conditioning system and a static pressure of air outside of the server room, a second output unit that outputs a control set value for rising a rotating speed of the air return fan when the static pressure of the air outside of the server room is higher than the static pressure in the air conditioning system based on the differential pressure measured by the second differential pressure gauge, a second rotating speed control unit that controls a rotating speed of the air return fan based on a control set value output by the second output unit.

5. A server managing system comprising:

a server room in which a server is installed between first and second spaces, the server having a fan that flows air from the first space into the second space, and supply air flowed into the first space is heated by heat generation of the server and flows out as return air via the second space, thereby to control air conditioning in the server room, a cold air generation device that generates cold air satisfying a predetermined condition;

an air supply fan that flows the cold air generated by the cold air generation device into the first space;

a first differential pressure gauge that measures a differential pressure of a static pressure of the second space with respect to a static pressure of the first space;

a return air thermometer that measures a temperature of the return air flowed out from the second space, a first control value decision unit that decides a first control value of a rotating speed of the air supply fan in order to prevent air from flowing from the second space into the first space based on the differential pressure measured by the first differential pressure gauge, a second control value decision unit that decides a second control value of the rotating speed of the air supply fan in order to lower a temperature of the return air when the temperature of the return air measured by the return air thermometer is higher than a set threshold value, a first output unit that outputs a control set value based on a larger control value between the first control value and the second control value, a first rotating speed control unit that controls the fan rotating speed based on the control set value output by the first output unit.

6. An air conditioning control method for managing a server room, in which a server is installed between first and second spaces, and supply air flowed into the first space is heated by heat generation of the server, and flows out as return air via the second space, thereby to control air conditioning in the server room, the air conditioning control method comprising:

generating supply air satisfying a predetermined condition by a cold air generation device;

flowing the supply air generated by the cold air generation device into the first space, by an air supply fan;

measuring a differential pressure of a static pressure of the second space with respect to a static pressure of the first space, by a first differential pressure gauge;

measuring a temperature of the return air flowed out from the second space, by a return air thermometer; and deciding a first control value of a rotating speed of the air supply fan in order to prevent air from flowing from the second space into the first space based on the differential pressure measured by the differential pressure gauge, deciding a second control value of the rotating speed of the air supply fan in order to lower a temperature of the return air when the temperature of the return air measured by the return air thermometer is higher than a set threshold value, outputting a control set value based on a larger control value between the first control value and the second control value, and controlling the rotating speed of the air supply fan based on the output control set value, by a control device.

* * * * *